United States Patent
Ritchey

(10) Patent No.: US 11,472,747 B2
(45) Date of Patent: Oct. 18, 2022

(54) ASSEMBLY FOR CHEMICAL VAPOR INFILTRATION OF A FIBER PREFORM AND METHOD OF INFILTRATING A FIBER PREFORM

(71) Applicant: Rolls-Royce High Temperature Composites Inc., Cypress, CA (US)

(72) Inventor: Andrew J. Ritchey, Seal Beach, CA (US)

(73) Assignee: ROLLS-ROYCE HIGH TEMPERATURE COMPOSITES INC., Cypress, CA (US)

( * ) Notice: Subject to any disclaimer, the term of this patent is extended or adjusted under 35 U.S.C. 154(b) by 273 days.

(21) Appl. No.: 16/596,054

(22) Filed: Oct. 8, 2019

(65) Prior Publication Data

US 2021/0101841 A1    Apr. 8, 2021

(51) Int. Cl.
*C04B 35/628* (2006.01)
*C04B 35/80* (2006.01)
(Continued)

(52) U.S. Cl.
CPC .. *C04B 35/62884* (2013.01); *C04B 35/62844* (2013.01); *C04B 35/80* (2013.01);
(Continued)

(58) Field of Classification Search
None
See application file for complete search history.

(56) References Cited

U.S. PATENT DOCUMENTS

| 5,916,633 A | 6/1999 | Lackey et al. |
| 7,658,781 B1 | 2/2010 | Waggoner et al. |

(Continued)

FOREIGN PATENT DOCUMENTS

| CN | 105461337 A | 4/2016 |
| EP | 1 936 006 A2 | 6/2008 |

(Continued)

OTHER PUBLICATIONS

Carminati (Thin Solid Films 664 (2018) 106-114) (Year: 2018).*
(Continued)

*Primary Examiner* — Joel G Horning
(74) *Attorney, Agent, or Firm* — Crowell & Moring LLP

(57) ABSTRACT

A method of infiltrating a fiber preform comprises positioning an assembly in a process chamber, where the assembly includes a tool comprising through-holes, a fiber preform constrained within the tool, and a sacrificial preform disposed between the fiber preform and the tool. The sacrificial preform is gas permeable. The process chamber is heated, and gaseous reactants are delivered into the process chamber during the heating. The gaseous reactants penetrate the through-holes of the tool and infiltrate the sacrificial preform and the fiber preform. Deposition of reaction products occurs on exposed surfaces of the fiber preform and the sacrificial preform, and a coating is formed thereon. In addition, the sacrificial preform accumulates excess coating material formed from increased reactions at short diffusion depths. Accordingly, the coating formed on the fiber preform exhibits a thickness variation of about 10% or less throughout a volume of the fiber preform.

20 Claims, 2 Drawing Sheets

(51) Int. Cl.
*C04B 40/00* (2006.01)
*C23C 16/04* (2006.01)
*C23C 16/458* (2006.01)

(52) U.S. Cl.
CPC ........ *C04B 40/0067* (2013.01); *C23C 16/045* (2013.01); *C23C 16/458* (2013.01); *C04B 2235/5208* (2013.01); *C04B 2235/75* (2013.01)

(56) References Cited

U.S. PATENT DOCUMENTS

| | | |
|---|---|---|
| 8,039,053 B2 | 10/2011 | Philippe et al. |
| 2012/0076927 A1* | 3/2012 | Bhatt ................ C04B 35/62884 427/122 |
| 2014/0363574 A1* | 12/2014 | Lazur .................. C04B 35/6286 427/255.38 |
| 2016/0297716 A1* | 10/2016 | Nakamura ............ C23C 16/045 |
| 2018/0141871 A1 | 5/2018 | Corman |
| 2019/0185387 A1 | 6/2019 | Jackson |
| 2019/0389774 A1* | 12/2019 | Goujard ................ C04B 35/571 |

FOREIGN PATENT DOCUMENTS

| | | |
|---|---|---|
| EP | 3 093 366 A1 | 11/2016 |
| WO | WO 2014/159178 A1 | 10/2014 |

OTHER PUBLICATIONS

Extended European Search Report, issued in EP Application No. 20194950.0, dated Oct. 22, 2020, pp. 1-4, European Patent Office, Munich, Germany.

* cited by examiner

ASSEMBLY FOR CHEMICAL VAPOR INFILTRATION OF A FIBER PREFORM AND METHOD OF INFILTRATING A FIBER PREFORM

TECHNICAL FIELD

The present disclosure relates generally to the fabrication of ceramic matrix composites (CMCs) and more particularly to an improved chemical vapor infiltration process.

BACKGROUND

Ceramic matrix composites have been identified as candidate materials for components in the hot-section of jet engines due to their high temperature capability, low weight, and low coefficient of thermal expansion. In some instances, these components may be manufactured by laying up plies of ceramic fibers to form a fiber preform, depositing an interphase coating on the ceramic fibers, depositing a matrix coating to rigidize the fiber preform, and infiltrating the rigidized preform with a ceramic slurry and then a melt to produce a densified ceramic matrix composite.

Deposition of the interphase and/or the matrix coatings may involve chemical vapor infiltration (CVI). In a typical CVI process, gaseous precursors are infiltrated into the fiber preform and the desired coating is formed by deposition of solid reaction products. For example, silicon carbide and boron nitride may be deposited according to the following chemical reactions, respectively:

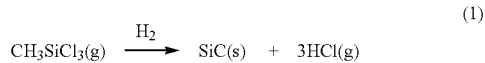

(1)

(2)

In addition to the chemical reactions occurring in the gas phase and/or on the fiber preform to form the coating, mass transfer of the gaseous reactants and reaction products through the fiber preform may occur by convection and/or diffusion depending on the deposition conditions (e.g., temperature, pressure, gas flow rate).

In an effort to achieve uniform deposition throughout the preform, CVI may be carried out at relatively low temperatures to control reaction rates and under reduced pressures to promote diffusion of the gaseous reactants within interstices or pores of the fiber preform. However, nonuniform deposition of the coating throughout the volume of the preform (e.g., as a function of depth or thickness) may still occur. Typically, higher coating thicknesses are found at near-surface depths, as illustrated in the bar graph of FIG. 2, which is discussed in greater detail below. It would be advantageous to improve the CVI process to increase the homogeneity of the deposited coating throughout the fiber preform.

BRIEF DESCRIPTION OF THE DRAWINGS

The embodiments may be better understood with reference to the following drawing(s) and description. The components in the figures are not necessarily to scale. Moreover, in the figures, like-referenced numerals designate corresponding parts throughout the different views.

DETAILED DESCRIPTION

Figure 1A:
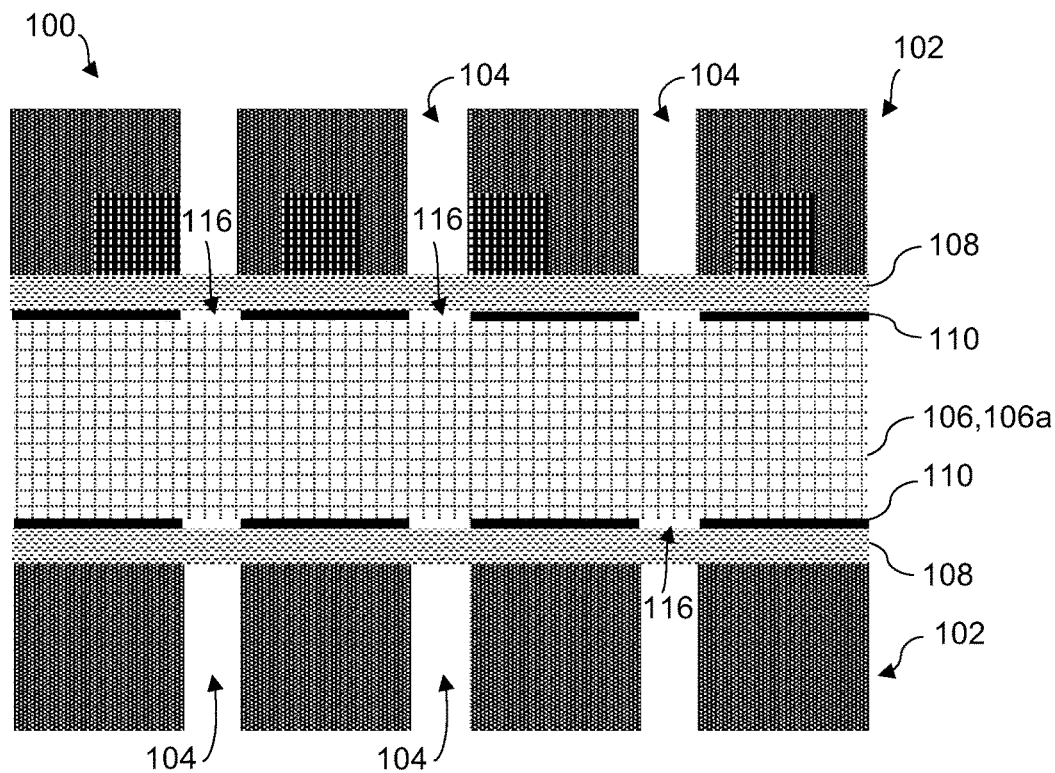
FIG. 1A is a cross-sectional schematic of an exemplary assembly for chemical vapor infiltration (CVI), where the assembly is shown prior to carrying out a CVI process.
Figure 1B:
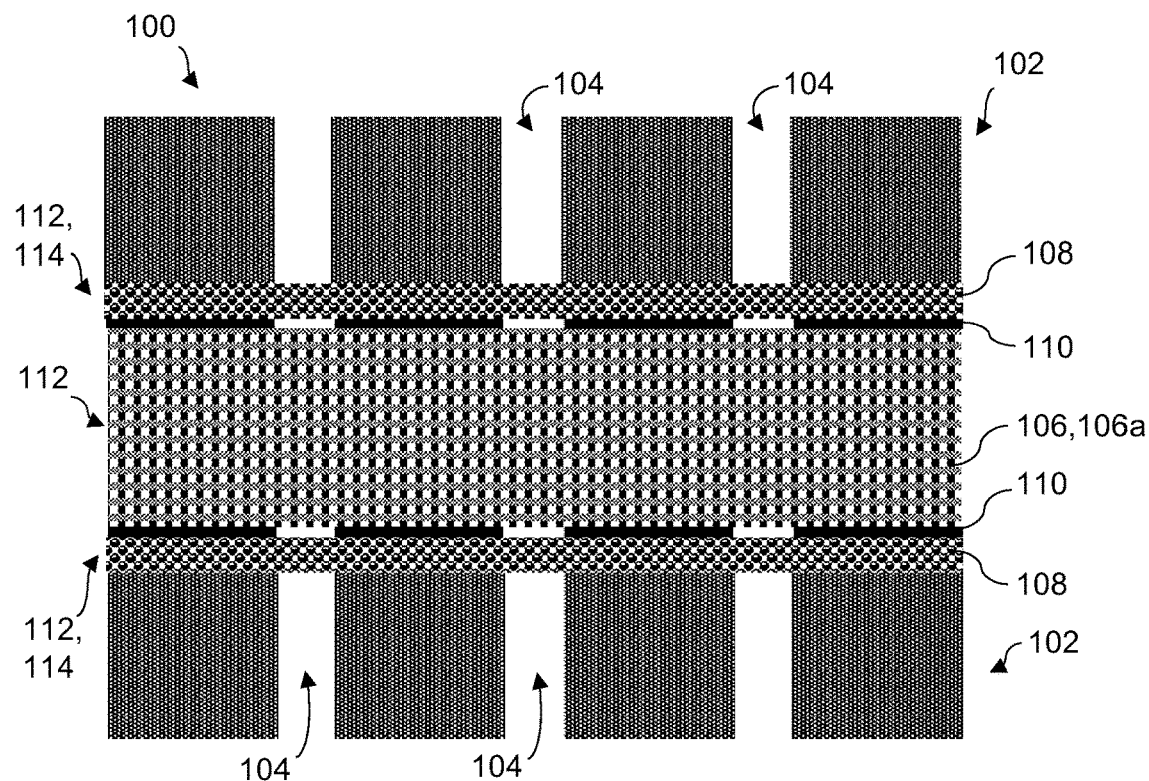
FIG. 1B is a cross-sectional schematic of an exemplary assembly for CVI, where the assembly is shown after carrying out a CVI process.

FIGS. 1A and 1B show cross-sectional views of an exemplary assembly for chemical vapor infiltration (CVI) that may enable a coating to be deposited more uniformly throughout the volume of a fiber preform; FIG. 1A shows the assembly 100 prior to CVI and FIG. 1B shows the assembly 100 after CVI and consequently after deposition of a coating 112 on exposed surfaces of an exemplary fiber preform 106. The coating 112 may be referred to as a "conformal coating" as it conforms to the shape of the exposed surfaces on which it is deposited. The fiber preform 106 comprises an arrangement of fibers 106a, such as a woven arrangement of fiber tows, with interstices between the fibers and/or fiber tows 106a that allow for infiltration of gaseous species during CVI. The assembly 100 for CVI and a method of infiltrating a fiber preform 106 to reduce coating nonuniformity are described in detail below.

Referring now to FIG. 1A, the assembly 100 comprises a tool 102 having through-holes 104 for passage of gaseous reactants during CVI. The fiber preform 106 is constrained within the tool 102 for deposition of reaction products from the gaseous reactants, and a sacrificial preform 108 is disposed between the fiber preform 106 and the tool 102. The sacrificial preform 108 is gas permeable to allow for diffusion of the gaseous reactants into the fiber preform 106. During CVI, deposition of (solid) reaction products occurs on exposed surfaces of the fiber preform 106 and the sacrificial preform 108. Thus, a coating 112 is formed thereon, as illustrated in FIG. 1B, and the sacrificial preform 108 further accumulates excess coating material 114 from enhanced reactions at short (near-surface) diffusion depths. In a conventional CVI process that does not include the sacrificial preform, the excess coating material may be deposited directly on the fiber preform, leading to inhomogeneity in the thickness of the coating. In contrast, employing the method described herein, the coating 112 deposited on the fiber preform 106 may exhibit a thickness variation of about 10% or less across the volume of the preform 106, and in some cases the thickness variation may be about 5% or less and/or as low as about 1%.

Figure 2:
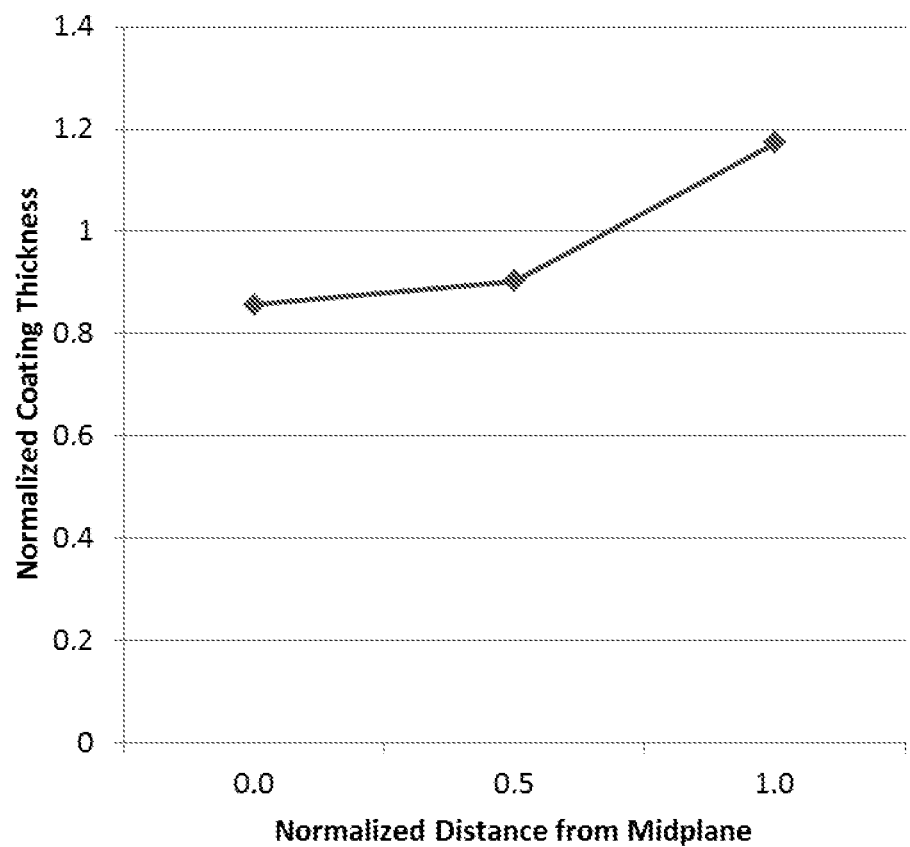
FIG. 2 is a chart showing normalized coating thickness versus normalized distance from a midplane of a fiber preform based on a number of CVI experiments carried out with standard CVI tooling (without a sacrificial preform).

To achieve the desired improvement in the uniformity of the coating 112 deposited on the fiber preform 106, the thickness of the sacrificial preform 108 may be selected to correspond to diffusion depths associated with the formation and deposition of excess coating material 114 in conventional CVI. FIG. 2 shows normalized coating thickness versus through-thickness location in a fiber preform (normalized distance from midplane) following a number of CVI experiments carried out without a sacrificial preform. The results of FIG. 2 were obtained from 400 measurements on 24 SiC fiber preforms, where each fiber preform had a constant thickness and a BN coating was deposited. FIG. 2 shows that excess coating material may be deposited at near-surface diffusion depths. It is preferred that the sacrificial preform 108 has a thickness in a range from about 0.1 mm to about 5 mm, or from about 0.5 mm to about 3 mm.

The sacrificial preform 108, which is gas permeable, may have a porosity of at least about 30 vol. % or at least about 50 vol. % to ensure the desired permeability and a surface area-to-volume ratio of at least about at least about 10,000 m$^{-1}$ or at least about 50,000 m$^{-1}$ to ensure the desired surface area for deposition. Typically, the porosity lies in a range from about 30 vol. % to about 50 vol. % or greater, and the surface area-to-volume ratio typically lies in a range from about 10,000 m$^{-1}$ to about 50,000 m$^{-1}$ or greater. The sacrificial preform 108 may comprise a foam, a 2D or 3D woven fiber fabric, a nonwoven fiber mat, and/or another porous or fiber-based structure. Suitable materials for the sacrificial preform 108 may include carbon (such as graphite or amorphous carbon) and silicon carbide, or similar materials which are chemically nonreactive and stable at elevated temperatures. For example, the sacrificial preform 108 may comprise carbon fibers (e.g., a carbon fiber fabric or carbon fiber mat), silicon carbide fibers (e.g., a silicon carbide fiber fabric), and/or a carbon foam (e.g., reticulated vitreous carbon foam). To facilitate ease of use and assembly, the sacrificial preform 108 is preferably flexible and/or deformable.

The assembly 100 may further include a release layer 110 between the fiber preform 106 and the sacrificial preform 108, as illustrated in FIGS. 1A and 1B. Advantageously, the release layer 110 comprises a low-friction material, e.g., a material having a coefficient of friction of about 0.2 or less, that may facilitate easy release of the fiber preform 106 from the sacrificial preform 108 once CVI is complete. The release layer 110 may take the form of a thin sheet or foil, typically having a thickness in a range from about 0.01 mm to about 2 mm, or from about 0.03 mm to about 1 mm. The release layer 110 may comprise graphite sheet or foil, which may be obtained commercially under the tradename Grafoil®, in one example.

Advantageously, the release layer 110 is configured for passage of the gaseous reactants therethrough and into the fiber preform 106. For example, the release layer 110 may include through-holes 116 formed by drilling or cutting which may be configured for alignment with the through-holes 104 of the tool 102 when assembled. Also or alternatively, the release layer 110 may be porous and thus gas-permeable.

The tool 102 may have a single-piece or multi-piece construction and may be formed of a chemically nonreactive, refractory material, such as graphite, silicon carbide or similar materials which are chemically nonreactive and stable at elevated temperatures. The tool 102 may be designed to constrain the fiber preform 106 in a predetermined position for the CVI process, and may be configured for easy removal after deposition of the coating(s) on the fiber preform 106. The through-holes 104 have a diameter or width sized to allow for a sufficient flow of gaseous reactants into the fiber preform 106 during CVI.

Figure 3:
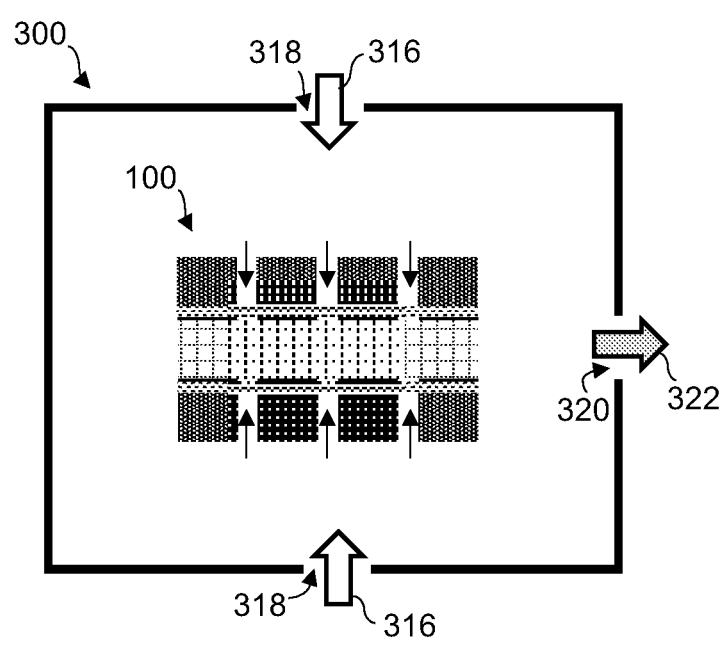
FIG. 3 is a schematic of a process chamber including the assembly of FIG. 1A.

A method of infiltrating a fiber preform to improve coating uniformity is now described in reference to the schematic of FIG. 3, along with FIGS. 1A and 1B. The method comprises positioning an assembly 100 in a process chamber 300, where the assembly 100 includes, as shown in FIG. 1A, a tool 102 having through-holes 104, a fiber preform 106 constrained within the tool 102, and a sacrificial preform 108 disposed between the fiber preform 106 and the tool 102, where the sacrificial preform 108 is gas permeable. A release layer 110 may lie between the sacrificial preform 108 and the fiber preform 106. To form the assembly, the fiber preform 106, the sacrificial preform 108, and the optional release layer 110 may be placed within the tool 102 and secured, e.g., by a clamping force. The assembly may be formed (assembled) inside or outside the process chamber 300.

To commence CVI, the process chamber 300 is heated, and gaseous reactants 316 are delivered into the process chamber 300. The gaseous reactants 316 flow into the assembly 100, penetrate the through-holes 104 and diffuse through the sacrificial preform 108 and into the fiber preform 106. Deposition of reaction products occurs on exposed (internal and/or external) surfaces of the fiber preform 106 and the sacrificial preform 108, forming a coating 112 on the exposed surfaces. Due to enhanced reactions at short (or near-surface) diffusion depths, the sacrificial preform 108 accumulates excess coating material 114 that might otherwise accumulate on the fiber preform and reduce the uniformity of the coating thickness. Consequently, the coating 112 deposited on the fiber preform 106 may be highly uniform with a thickness variation of about 10% or less throughout the volume of the preform 106. Advantageously, the thickness variation may be about 5% or less and may also be as low as 1%.

The heating of the process chamber 300 may occur directly or indirectly. For example, the process chamber 300 may be directly heated by an external or internal heat source (i.e., by a heat source positioned outside or inside the process chamber 300, respectively). In such a case, the assembly 100 and/or the gaseous reactants 316 may be indirectly heated, that is, heated as a consequence of the direct heating of the process chamber 300. Alternatively, the assembly 100 and/or the gaseous reactants 316 may be directly heated by an internal or external heat source. In this case, the process chamber 300 may be indirectly heated, that is, heated as a consequence of the direct heating of the assembly 100 and/or the gaseous reactants 316. Accordingly, a reference to "heating the process chamber" encompasses both direct and indirect heating of the process chamber 300, and may include direct heating of the process chamber 300, the assembly 100, and/or the gaseous reactants 316.

The process chamber 300 is configured to provide a controlled environment for CVI. The process chamber 300 may be a commercially available vacuum chamber or furnace including at least one inlet port 318 in fluid communication with one or more precursor gas sources, such as gas cylinders containing $CH_3SiCl_3$ and $H_2$ in the case of a coating 112 comprising SiC. Components referred to as being "in fluid communication with" each other are understood to be directly or indirectly connected or otherwise related in such a way that fluid (e.g., a gas) can flow between the components in one or both directions. The process chamber 300 may also include at least one exit port 320 to expel gaseous reaction products 322.

In a typical CVI process, the process chamber 300 and/or the assembly 100 is/are heated to a temperature in a range from about 600° C. to about 1500° C. The heating may be isothermal, such that temperature gradients in the process chamber 300 are avoided, or the heating may entail establishing a temperature gradient in the process chamber 300. In one example, the process chamber 300 is directly heated by an external heat source and the assembly 100 within the chamber is indirectly heated by radiation. During CVI, an interior of the process chamber 300 is typically maintained at a pressure below atmospheric pressure (760 Torr). For example, the process chamber 300 may be maintained at a pressure in a range from about 1 Torr to about 50 Torr during delivery of the gaseous reactants and deposition of the reaction products. Thus, prior to introducing the gaseous reactants, the process chamber 300 may be evacuated to a desired sub-atmospheric pressure level using one or more vacuum pumps. During CVI, the gaseous reactants 316 may be delivered into the chamber 300 at a flow rate that depends on chamber volume. Exemplary CVI processes that may be employed with the inventive assembly 100 are described in U.S. Pat. No. 10,227,696, which is hereby incorporated by reference.

The gaseous reactants 316 may include two or more gases and may be selected as known in the art to produce a coating 112 of the desired composition. As would be recognized by the skilled artisan, the excess coating material 114 deposited on the sacrificial preform 108 may have the same composition as the coating 112. In one example, the gaseous reactants 316 may comprise $BX_3$ and $NH_3$, where X is selected from the group consisting of F and Cl, to produce a coating 112 comprising boron nitride (BN), which may serve as an interphase coating to enhance toughness and crack deflection in the final composite. In another example, the gaseous reactants 316 may comprise boron trichloride ($BCl_3$), ammonia ($NH_3$) and a silicon precursor such as dichlorosilane ($H_2Cl_2Si$), trichlorosilane ($HCl_3Si$), silicon tetrachloride ($SiCl_4$), and/or silane ($SiH_4$) to produce a silicon-doped boron nitride interphase coating. Typically, a coating 112 comprising boron nitride, silicon-doped boron nitride or another interphase coating material, such as pyrolytic carbon, has a thickness in a range from 0.1 micron to about 1 micron. In yet another example, the gaseous reactants 316 may comprise methyltrichlorosilane ($CH_3SiCl_3$) and $H_2$ to produce a coating 112 comprising silicon carbide (SiC), which is a typical matrix material and may serve as a rigidization coating. Given its rigidization function, a coating 112 comprising silicon carbide or another matrix material may have a thickness in a range from about 1 micron to about 10 microns.

The method may be employed to deposit more than one coating on the fiber preform. For example, the gaseous reactants referred to in the above description may be first gaseous reactants, the reaction products may be first reaction products, and the coating may be a first coating. The method may further comprise, after forming the first coating, halting delivery of the first gaseous reactants into the process chamber, and delivering second gaseous reactants into the process chamber. The second gaseous reactants may penetrate the through-holes and infiltrate the sacrificial preform and the fiber preform, and deposition of second reaction products may occur on exposed surfaces of the fiber preform and the sacrificial preform, such that a second coating is formed on the fiber preform (more specifically, on the first coating). Due to increased reactions at short diffusion depths, the sacrificial preform accumulates excess coating material that might otherwise accumulate on the fiber preform and lead to thickness nonuniformities. Accordingly, the second coating deposited on the fiber preform may exhibit—like the first coating—a thickness variation of about 10% or less, or even about 5% or less or as low at 1%, throughout a volume of the fiber preform.

Typically, the first coating may be an interphase coating comprising boron nitride or pyrolytic carbon, and the second coating may be a rigidization coating comprising silicon carbide, silicon nitride, alumina, aluminum nitride, aluminosilicate, or another matrix material. In one example, the first gaseous reactants may comprise $BX_3$ and $NH_3$, where X is selected from the group consisting of F and Cl, and the first coating may comprise BN. Alternatively, the first gaseous reactants may comprise $BCl_3$, $NH_3$ and a silicon precursor such as $HCl_3Si$, and the first coating may comprise Si-doped BN. The second gaseous reactants may comprise $CH_3SiCl_3$ and $H_2$, and the second coating may comprise SiC. Additional coating(s) (e.g., a third coating, a fourth coating, up to an $n^{th}$ coating, where n is an integer as high as 20) may be deposited if desired as set forth above, and each of the n coatings may have any of the characteristics (e.g., composition, thickness, uniformity, function, etc.) described herein.

The sacrificial preform may be re-used, e.g., for delivery of the second gaseous reactants after the first coating has been formed. Alternatively, the sacrificial preform may be replaced with a new (unused) sacrificial preform after the first coating is formed and prior to the delivery of the second gaseous reactants. After coating deposition, the assembly may be removed from the process chamber, and/or the fiber preform may be removed from the assembly and from the process chamber.

The fiber preform employed in the method comprises a framework of fibers, which may be arranged in tows and may be woven or unwoven. The framework may be formed by, in one example, laying up plies comprising tows of fibers in a two- or three-dimensional weave. After the CVI method as described herein is carried out, the fiber preform, which may be a rigidized fiber preform as set forth above, may be infiltrated with a slurry comprising ceramic particles and optionally reactive elements to form an impregnated fiber preform, i.e., a fiber preform loaded with particulate matter. Such an impregnated fiber preform typically comprises a loading level of particulate matter from about 40 vol. % to about 60 vol. %, with the remainder being porosity. The fiber preform (e.g., the impregnated fiber preform) may undergo melt infiltration for densification to form a ceramic matrix composite. The temperature at which melt infiltration of the fiber preform is carried out may depend on the metal or alloy (typically silicon or a silicon alloy) forming the melt and is generally at or above the melting temperature of the metal or alloy. Melt infiltration may be carried out for a time duration of several minutes to several hours, depending in part on the size and complexity of the fiber preform. Upon cooling, a densified ceramic matrix composite may be obtained.

The fibers that serve as the framework of the fiber preform typically comprise silicon carbide, but may also or alternatively comprise another ceramic, such as silicon nitride, alumina, or aluminosilicate, or carbon. Preferably, the fibers are silicon carbide fibers, and the ceramic matrix composite includes a matrix comprising silicon carbide. Thus, the ceramic matrix composite may be referred to as a SiC/SiC composite. The ceramic matrix composite may form part or all of a component of a gas turbine engine, such as a blade, vane, combustor liner or seal segment.

To clarify the use of and to hereby provide notice to the public, the phrases "at least one of <A>, <B>, . . . and <N>" or "at least one of <A>, <B>, <N>, or combinations thereof" or "<A>, <B>, . . . and/or <N>" are defined by the Applicant in the broadest sense, superseding any other implied definitions hereinbefore or hereinafter unless expressly asserted by the Applicant to the contrary, to mean one or more elements selected from the group comprising A, B, . . . and N. In other words, the phrases mean any combination of one or more of the elements A, B, . . . or N including any one element alone or the one element in combination with one or more of the other elements which may also include, in combination, additional elements not listed. Unless otherwise indicated or the context suggests otherwise, as used herein, "a" or "an" means "at least one" or "one or more."

While various embodiments have been described, it will be apparent to those of ordinary skill in the art that many more embodiments and implementations are possible. Accordingly, the embodiments described herein are examples, not the only possible embodiments and implementations.

The subject-matter of the disclosure may also relate, among others, to the following aspects:

A first aspect relates to a method of infiltrating a fiber preform that comprises: positioning an assembly in a process chamber, the assembly comprising: a tool comprising through-holes; a fiber preform constrained within the tool; and a sacrificial preform disposed between the fiber preform and the tool, the sacrificial preform being gas permeable, heating the process chamber; delivering gaseous reactants into the process chamber during the heating, the gaseous reactants penetrating the through-holes and infiltrating the sacrificial preform and the fiber preform, wherein deposition of reaction products occurs on exposed surfaces of the fiber preform and the sacrificial preform to form a coating thereon, and the sacrificial preform accumulates excess coating material formed from increased reactions at short diffusion depths, whereby the coating formed on the fiber preform exhibits a thickness variation of about 10% or less throughout a volume of the fiber preform.

A second aspect relates to the method of the first aspect, wherein the thickness variation is about 5% or less.

A third aspect relates to the method of the first or second aspect, wherein the process chamber is heated to a temperature in a range from 600° C. to about 1500° C.

A fourth aspect relates to the method of any preceding aspect, wherein the process chamber is heated isothermally or wherein the process chamber is heated so as to establish a thermal gradient.

A fifth aspect relates to the method of any preceding aspect, wherein the process chamber is maintained at a pressure in a range from about 1 Torr to about 50 Torr during delivery of the gaseous reactants.

A sixth aspect relates to the method of any preceding aspect, wherein the sacrificial preform comprises a porosity of about 30 vol. % or greater.

A seventh aspect relates to the method of any preceding aspect, wherein the sacrificial preform comprises a surface area-to-volume ratio of at least about 10,000 $m^{-1}$.

An eighth aspect relates to the method of any preceding aspect, wherein the sacrificial preform comprises cloth or foam comprising carbon or silicon carbide.

A ninth aspect relates to the method of any preceding aspect, wherein the gaseous reactants are first gaseous reactants, wherein the reaction products are first reaction products, and wherein the coating is a first coating, and further comprising, after forming the first coating: halting delivery of the first gaseous reactants into the process chamber; and delivering second gaseous reactants into the process chamber, the second gaseous reactants penetrating the through-holes and infiltrating the sacrificial preform and the fiber preform, wherein deposition of second reaction products occurs on exposed surfaces of the fiber preform and the sacrificial preform, forming a second coating on the first coating, and the sacrificial preform accumulates excess coating material formed from increased reactions at short diffusion depths, whereby the second coating deposited on the first coating exhibits a thickness variation of about 10% or less throughout a volume of the fiber preform.

A tenth aspect relates to the method of the ninth aspect, wherein the first gaseous reactants comprise $BX_3$, $NH_3$, and a silicon precursor, where X is selected from the group consisting of F and Cl, and wherein the first coating comprises silicon-doped boron nitride, wherein the second gaseous reactants comprise $CH_3SiCl_3$ and $H_2$, and wherein the second coating comprises silicon carbide, and wherein the fiber preform includes fibers comprising silicon carbide.

An eleventh aspect relates to the method of the ninth or tenth aspect, wherein the sacrificial preform is re-used for delivery of the second gaseous reactants.

A twelfth aspect relates to the method any of the ninth through eleventh aspects, wherein the sacrificial preform is replaced for delivery of the second gaseous reactants.

A thirteenth aspect relates to an assembly for chemical vapor deposition, the assembly comprising a tool comprising through-holes for passage of gaseous reactants; a fiber preform constrained within the tool for deposition of reaction products from the gaseous reactants; and a sacrificial preform disposed between the fiber preform and the tool, the sacrificial preform being gas permeable to allow for diffusion of the gaseous reactants into the fiber preform.

A fourteenth aspect relates to the assembly of the thirteenth aspect, wherein, during CVI, deposition of reaction products occurs on exposed surfaces of the fiber preform and the sacrificial preform, forming a coating thereon, and the sacrificial preform accumulates excess coating material from enhanced reactions at short diffusion depths, whereby the coating formed on the fiber preform exhibits a thickness variation of about 10% or less throughout a volume of the fiber preform.

A fifteenth aspect relates to the assembly of the thirteenth or fourteenth aspect, wherein the sacrificial preform comprises a thickness in a range from about 0.1 mm to about 5 mm.

A sixteenth aspect relates to the assembly of any of the thirteenth through the fifteenth aspects, wherein the sacrificial preform comprises a porosity of about 30 vol. % or greater, and/or a surface area-to-volume ratio of at least about 10,000 $m^{-1}$.

A seventeenth aspect relates to the assembly of any of the thirteenth through the sixteenth aspects, wherein the sacrificial preform comprises cloth or foam comprising carbon.

An eighteenth aspect relates to the assembly of any of the thirteenth through the seventeenth aspects, wherein the sacrificial preform comprises graphite fibers, amorphous carbon fibers, and/or reticulated vitreous carbon foam.

A nineteenth aspect relates assembly of the eighteenth aspect, further comprising a release layer between the fiber preform and the sacrificial preform, the release layer comprising a low-friction material and having a thickness in a range from about 0.01 mm to about 2 mm.

A twentieth aspect relates to the assembly of any of the thirteenth through the nineteenth aspects, wherein the low friction material comprises graphite.

In addition to the features mentioned in each of the independent aspects enumerated above, some examples may show, alone or in combination, the optional features mentioned in the dependent aspects and/or as disclosed in the description above and shown in the figures.

What is claimed is:

1. A method of infiltrating a fiber preform, the method comprising:
   positioning an assembly in a process chamber, the assembly comprising:
      a tool comprising through-holes;
      a fiber preform constrained within the tool;
      a sacrificial preform disposed between the fiber preform and the tool, the sacrificial preform being gas permeable; and a release layer between the fiber preform and the sacrificial preform, the release layer including holes and/or pores for passage of gaseous reactants therethrough and comprising a material having a coefficient of friction of about 0.2 or less with respect to the fiber preform;

heating the process chamber;

during the heating, delivering gaseous reactants into the process chamber, the gaseous reactants penetrating the through-holes and passing through the holes and/or pores of the release layer to infiltrate the sacrificial preform and the fiber preform, wherein deposition of reaction products occurs on exposed surfaces of the fiber preform and the sacrificial preform, forming a coating thereon, and the sacrificial preform accumulates excess coating material, whereby the coating formed on the fiber preform exhibits a thickness variation of about 10% or less throughout a volume of the fiber preform.

2. The method of claim 1, wherein the thickness variation is about 5% or less.

3. The method of claim 1, wherein the process chamber is heated to a temperature in a range from 600° C. to about 1500° C.

4. The method of claim 1, wherein the process chamber is heated isothermally or wherein the process chamber is heated so as to establish a temperature gradient.

5. The method of claim 1, wherein the process chamber is maintained at a pressure in a range from about 1 Torr to about 50 Torr during delivery of the gaseous reactants.

6. The method of claim 1, wherein the sacrificial preform comprises a porosity of about 30 vol. % or greater.

7. The method of claim 1, wherein the sacrificial preform comprises a surface area-to-volume ratio of at least about 10,000 m$^{-1}$.

8. The method of claim 1, wherein the sacrificial preform comprises cloth or foam comprising carbon or silicon carbide.

9. The method of claim 1, wherein the gaseous reactants are first gaseous reactants, wherein the reaction products are first reaction products, and wherein the coating is a first coating, and further comprising, after forming the first coating:

halting delivery of the first gaseous reactants into the process chamber; and delivering second gaseous reactants into the process chamber, the second gaseous reactants penetrating the through-holes and infiltrating the sacrificial preform and the fiber preform, wherein deposition of second reaction products occurs on exposed surfaces of the fiber preform and the sacrificial preform, forming a second coating on the first coating, and the sacrificial preform accumulates excess coating material, whereby the second coating deposited on the first coating exhibits a thickness variation of about 10% or less throughout a volume of the fiber preform.

10. The method of claim 9, wherein the first gaseous reactants comprise $BX_3$, $NH_3$, and a silicon precursor, where X is selected from the group consisting of F and Cl, and wherein the first coating comprises silicon-doped boron nitride, wherein the second gaseous reactants comprise $CH_3SiCl_3$ and $H_2$, and wherein the second coating comprises SiC, and wherein the fiber preform includes fibers comprising silicon carbide.

11. The method of claim 9, wherein the sacrificial preform is re-used for delivery of the second gaseous reactants.

12. The method of claim 9, wherein the sacrificial preform is replaced for delivery of the second gaseous reactants.

13. The method of claim 9, further comprising, after forming the second coating, releasing the fiber preform from the sacrificial preform and removing the fiber preform from the process chamber.

14. The method of claim 1, further comprising, after forming the coating, releasing the fiber preform from the sacrificial preform and removing the fiber preform from the process chamber.

15. The method of claim 1, wherein the material comprises graphite.

16. The method of claim 1, wherein the release layer has a thickness in a range from about 0.01 mm to about 2 mm.

17. The method of claim 1, wherein the sacrificial preform has a thickness in a range from about 0.1 mm to about 5 mm.

18. The method of claim 1, wherein the sacrificial preform comprises a foam.

19. The method of claim 1, wherein the sacrificial preform comprises carbon fibers and/or a carbon foam.

20. A method of infiltrating a fiber preform, the method comprising:

positioning an assembly in a process chamber, the assembly comprising:

a tool comprising through-holes;

a fiber preform constrained within the tool; and a sacrificial preform disposed between the fiber preform and the tool, the sacrificial preform being gas permeable and comprising carbon fibers and/or a carbon foam;

heating the process chamber;

during the heating, delivering gaseous reactants into the process chamber, the gaseous reactants penetrating the through-holes and infiltrating the sacrificial preform and the fiber preform, wherein deposition of reaction products occurs on exposed surfaces of the fiber preform and the sacrificial preform, forming a coating thereon, and the sacrificial preform accumulates excess coating material, whereby the coating formed on the fiber preform exhibits a thickness variation of about 10% or less throughout a volume of the fiber preform.

* * * * *

UNITED STATES PATENT AND TRADEMARK OFFICE
CERTIFICATE OF CORRECTION

PATENT NO. : 11,472,747 B2
APPLICATION NO. : 16/596054
DATED : October 8, 2019
INVENTOR(S) : Andrew J. Ritchey It is certified that error appears in the above-identified patent and that said Letters Patent is hereby corrected as shown below:

In the Claims

Column 10, Line 3, Claim 10, delete "CI," and replace with --Cl,--
Column 10, Line 43, Claim 20, delete "carbon fibers and/or"

Signed and Sealed this
Sixth Day of December, 2022

Katherine Kelly Vidal
*Director of the United States Patent and Trademark Office*